US012162206B2

(12) United States Patent
Sato

(10) Patent No.: US 12,162,206 B2
(45) Date of Patent: Dec. 10, 2024

(54) IMPRINT APPARATUS AND METHOD OF MANUFACTURING ARTICLE

(71) Applicant: CANON KABUSHIKI KAISHA, Tokyo (JP)

(72) Inventor: Hiroshi Sato, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 294 days.

(21) Appl. No.: 17/408,721

(22) Filed: Aug. 23, 2021

(65) Prior Publication Data

US 2022/0063177 A1 Mar. 3, 2022

(30) Foreign Application Priority Data

Aug. 26, 2020 (JP) ................................ 2020-142790

(51) Int. Cl.
*B29C 59/02* (2006.01)
*B29C 59/00* (2006.01)
*B29L 31/34* (2006.01)
*G03F 7/00* (2006.01)
*B29L 31/00* (2006.01)

(52) U.S. Cl.
CPC ............ *B29C 59/02* (2013.01); *B29C 59/002* (2013.01); *G03F 7/0002* (2013.01); *B29L 2031/3406* (2013.01); *B29L 2031/756* (2013.01)

(58) Field of Classification Search
CPC ..... B29C 59/02; B29C 59/002; G03F 7/0002; G03F 9/7049; G03F 9/7088; G03F 9/7042
See application file for complete search history.

(56) References Cited

U.S. PATENT DOCUMENTS

| 9,946,156 | B2 | 4/2018 | Sato | |
|---|---|---|---|---|
| 2010/0110434 | A1* | 5/2010 | Choi | G03F 9/7084 356/401 |
| 2015/0049317 | A1* | 2/2015 | Mishima | G03F 7/70141 355/67 |
| 2015/0146207 | A1* | 5/2015 | Kawashima | G03F 7/0002 101/450.1 |
| 2016/0075076 | A1* | 3/2016 | Sato | G03F 7/0002 264/40.5 |

FOREIGN PATENT DOCUMENTS

| JP | H08153663 A | 6/1996 |
|---|---|---|
| JP | 2014203935 A | 10/2014 |
| JP | 2017199760 A | 11/2017 |

\* cited by examiner

*Primary Examiner* — Jerzi H Moreno Hernandez
(74) *Attorney, Agent, or Firm* — ROSSI, KIMMS & McDOWELL LLP

(57) ABSTRACT

The present invention provides an imprint apparatus that performs a process of forming an imprint material on a substrate using a mold, with respect to each of a plurality of shot regions on the substrate, the apparatus comprising: a detector configured to detect positions of marks provided in the substrate; and a controller configured to control, in the process, alignment between the substrate and the mold based on a detection result by the detector, wherein each of the plurality of shot regions includes two or more transfer regions where a pattern of an original has been individually transferred in a pre-process, and in the process on a specific shot region, the controller controls the alignment based on the detection result of the marks provided in the transfer region other than the smallest transfer region among the two or more transfer regions.

12 Claims, 10 Drawing Sheets

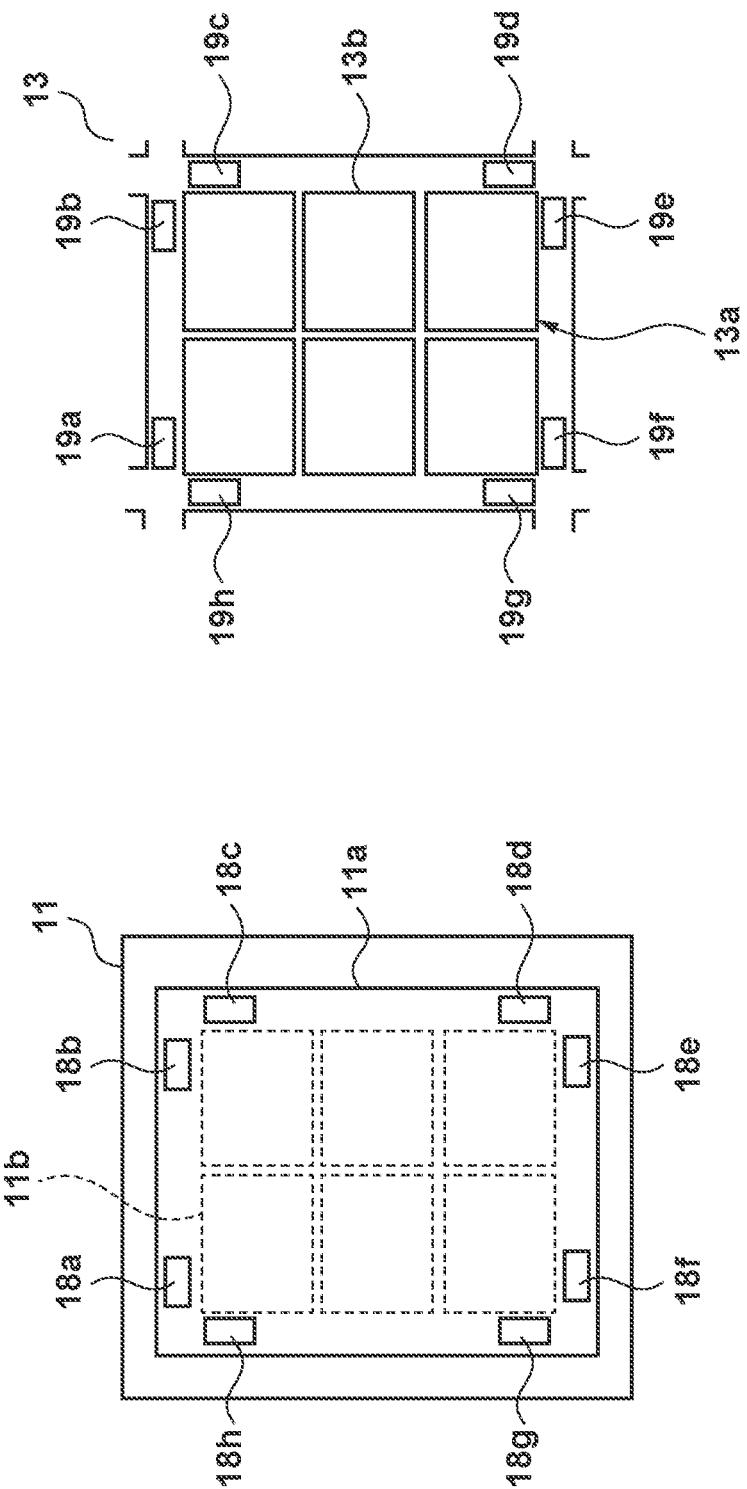

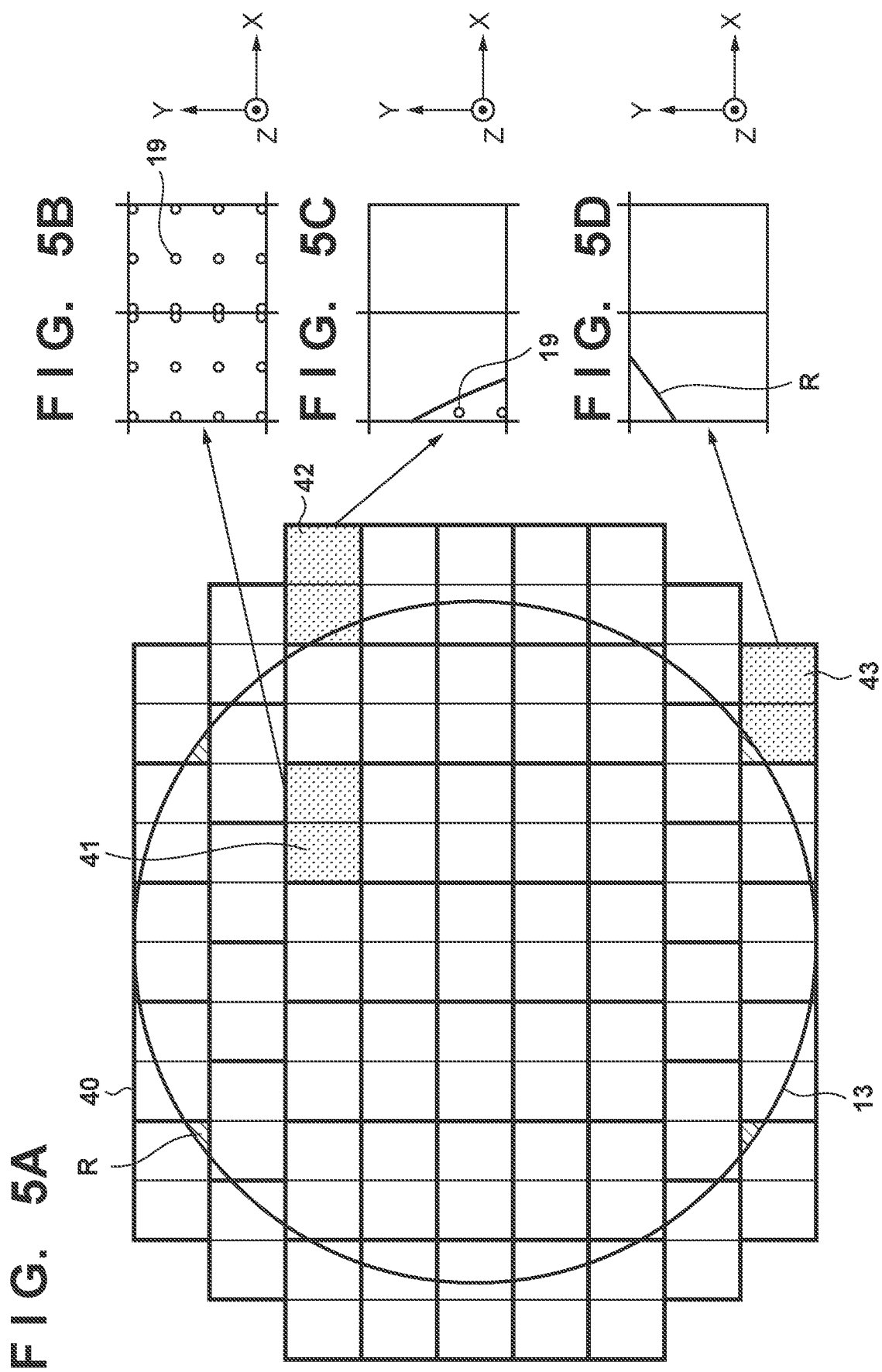

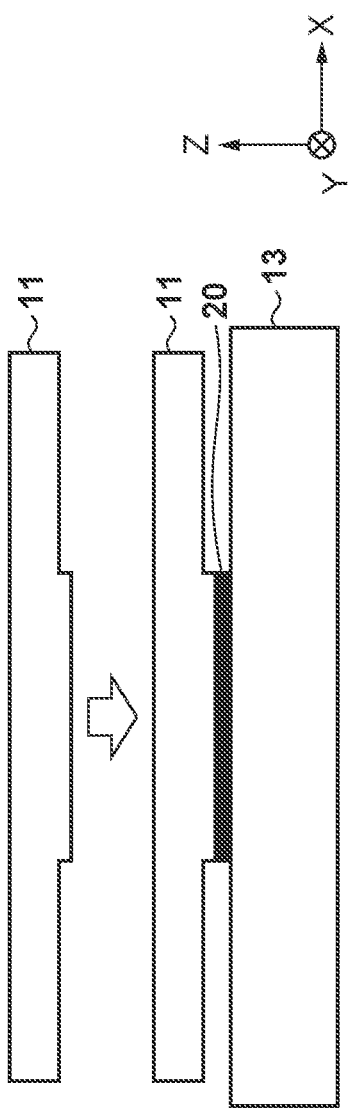
F I G. 6A
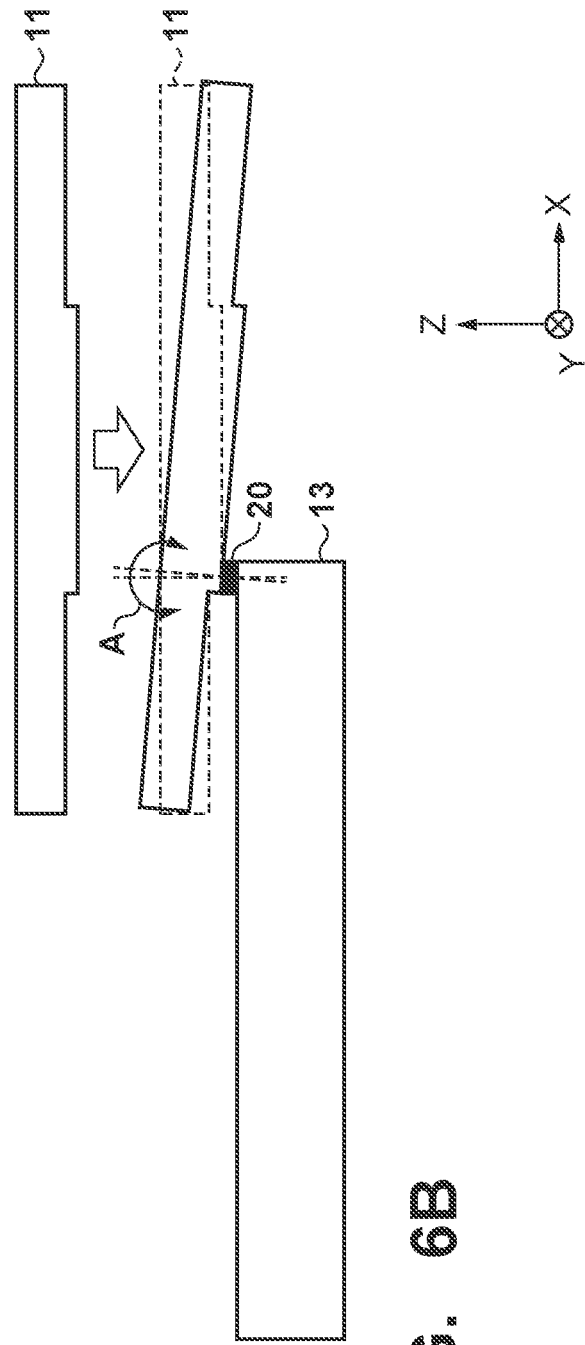
F I G. 6B

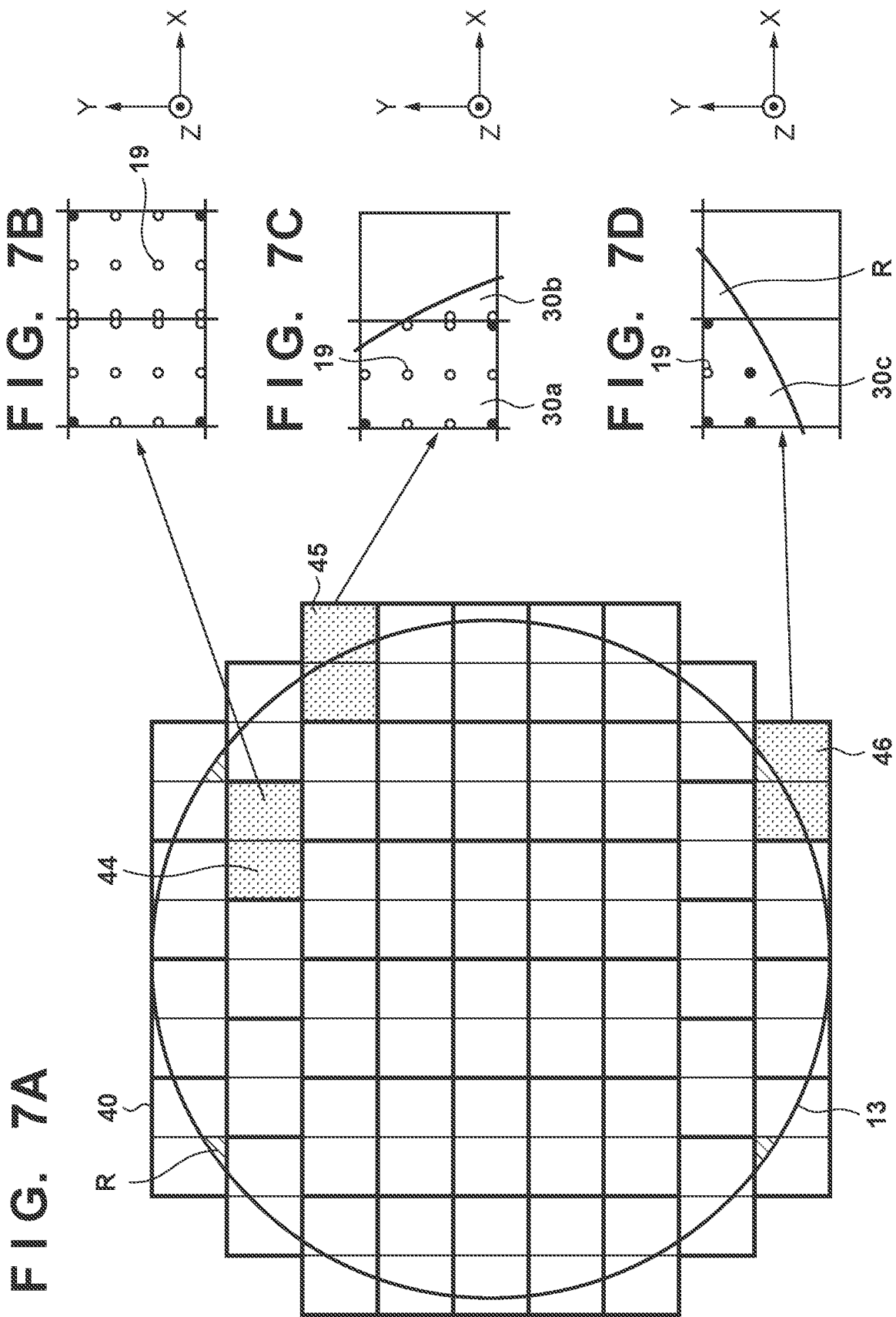

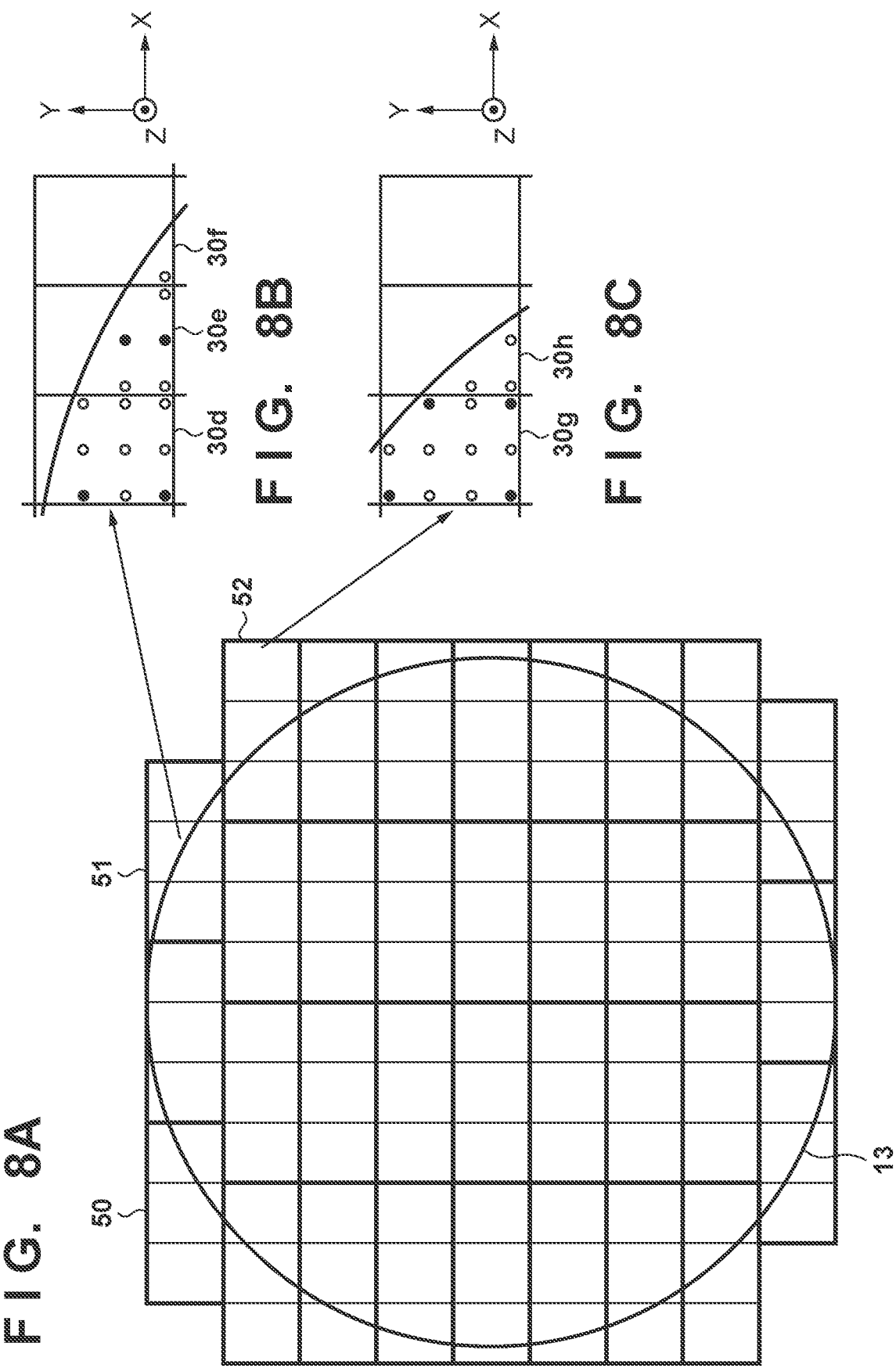

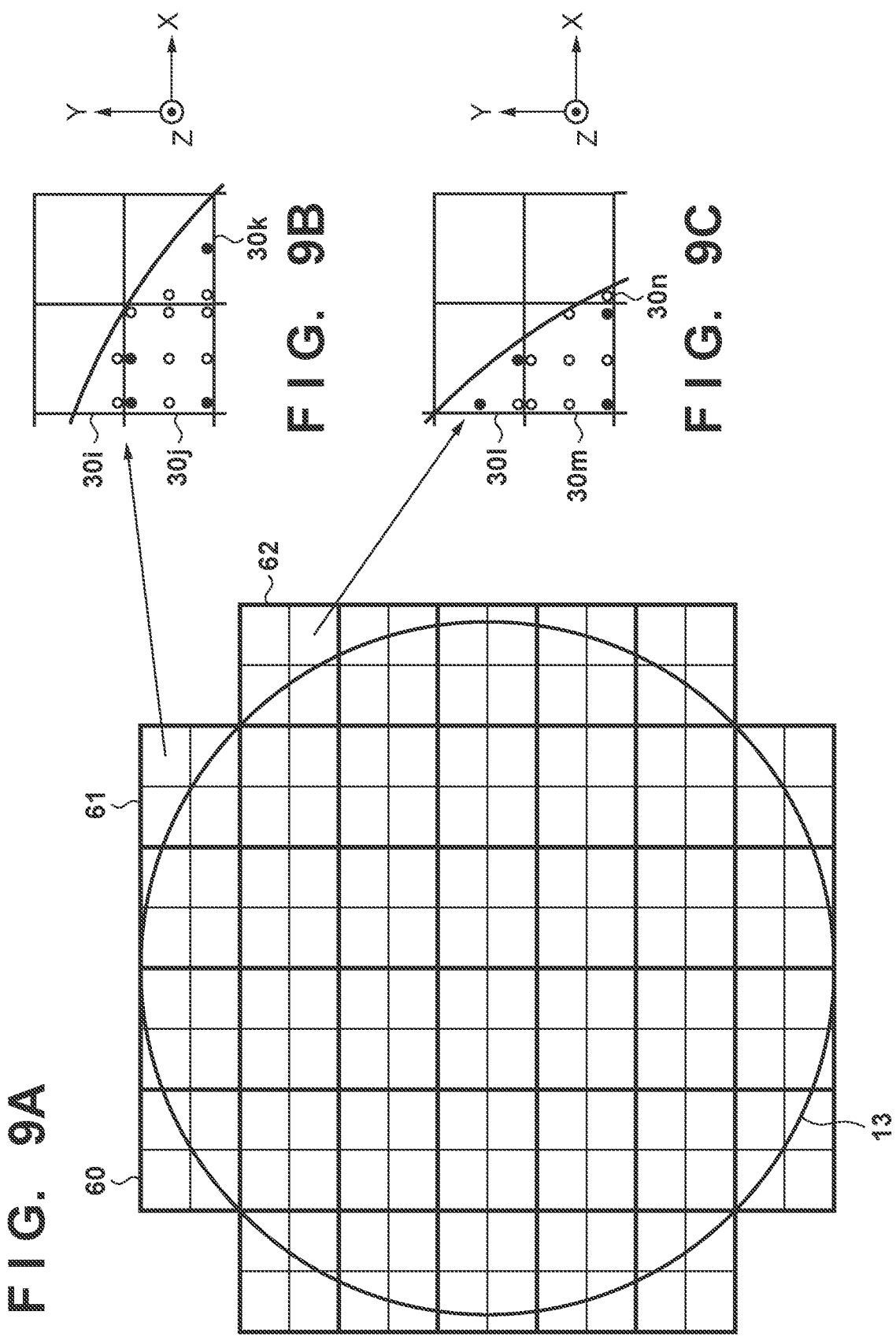

IMPRINT APPARATUS AND METHOD OF MANUFACTURING ARTICLE

BACKGROUND OF THE INVENTION

Field of the Invention

The present invention relates to an imprint apparatus and a method of manufacturing an article.

Description of the Related Art

An imprint technique is a technique capable of transferring a nanoscale fine pattern, and has been proposed as one mass production nanolithography technique for semiconductor devices, magnetic storage media, or the like. An imprint apparatus using the imprint technique can form a pattern on a substrate by curing an imprint material on the substrate in a state in which a mold with the pattern formed therein and the imprint material are in contact with each other, and then separating the mold from the cured imprint material.

In recent years, in order to improve the productivity (throughput) of the imprint apparatus, development of a so-called multi-area imprint technique is in progress, in which an imprint process is collectively performed on two or more transfer regions where the pattern of an original has been individually transferred in a pre-process. Japanese Patent Laid-Open No. 2017-199760 proposes a method of performing multi-area imprinting in the central portion of a substrate.

In the imprint apparatus, from the viewpoint of improvement in yield of semiconductor chips, protection of a substrate in an etching process in a post-process, and the like, it is requested to accurately form the imprint material not only in the central portion of the substrate but also in the peripheral edge portion of the substrate.

SUMMARY OF THE INVENTION

The present invention provides, for example, a technique advantageous in accurately forming an imprint material on a substrate.

According to one aspect of the present invention, there is provided an imprint apparatus that performs a process of forming an imprint material on a substrate using a mold, with respect to each of a plurality of shot regions on the substrate, the apparatus comprising: a detector configured to detect positions of marks provided in the substrate; and a controller configured to control, in the process, alignment between the substrate and the mold based on a detection result by the detector, wherein each of the plurality of shot regions includes two or more transfer regions where a pattern of an original has been individually transferred in a pre-process, and in the process on a specific shot region where the two or more transfer regions have different sizes, the controller controls the alignment based on the detection result of the marks provided in the transfer region other than the smallest transfer region among the two or more transfer regions.

Further features of the present invention will become apparent from the following description of exemplary embodiments with reference to the attached drawings.

BRIEF DESCRIPTION OF THE DRAWINGS

FIGS. 2A and 2B are views showing mold-side marks and substrate-side marks, respectively;

FIGS. 5A to 5D are views showing a conventional example of the layout of a plurality of shot regions;

FIGS. 6A and 6B are views for explaining a contact step between a mold and a resin on the substrate;

FIGS. 7A to 7D are views showing a layout example of a plurality of shot regions according to the first embodiment;

FIGS. 8A to 8C are views showing a layout example of a plurality of shot regions according to the second embodiment;

FIGS. 9A to 9C are views showing a layout example of a plurality of shot regions according to the third embodiment.

DESCRIPTION OF THE EMBODIMENTS

Figure 1:
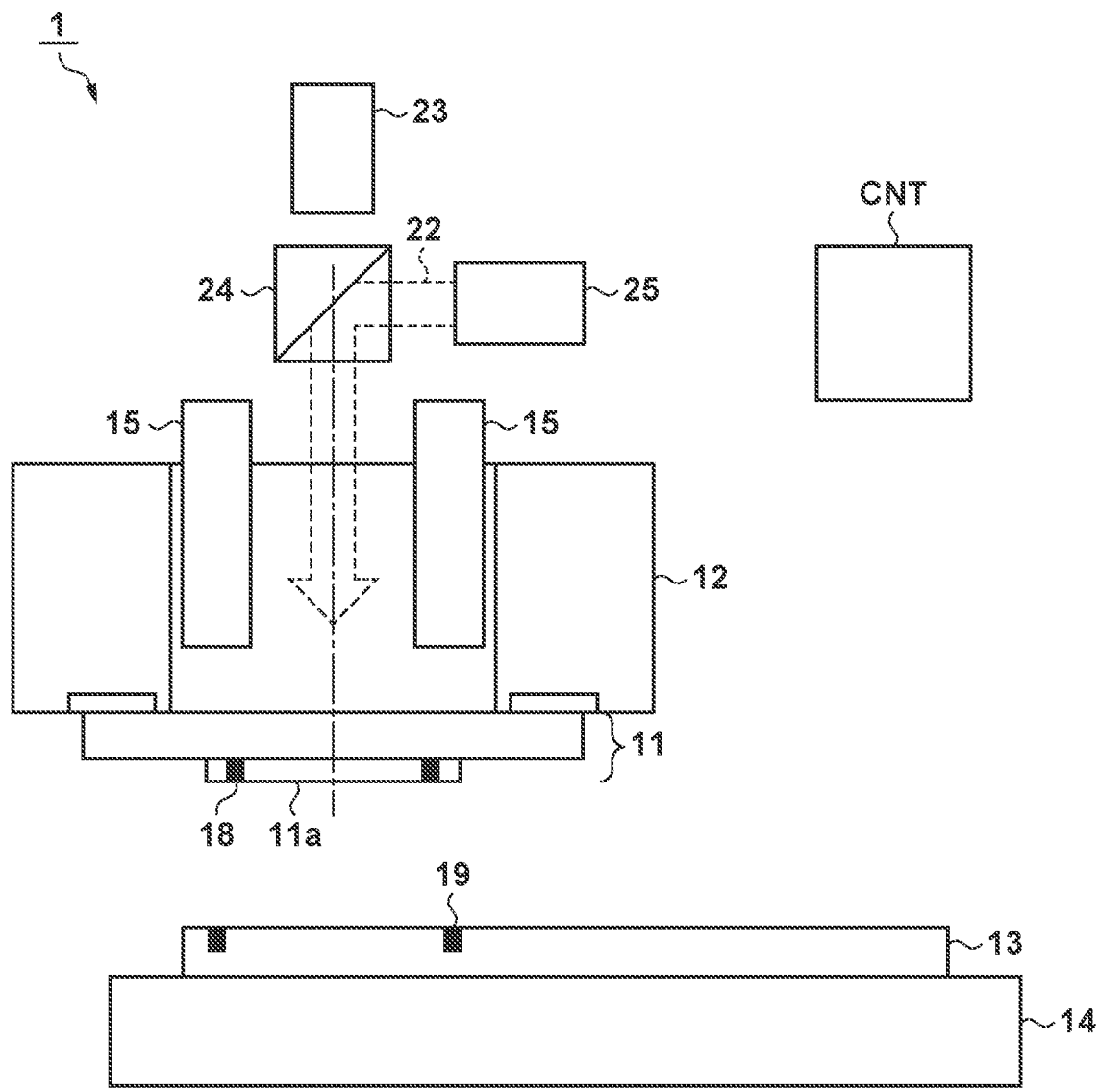
FIG. 1 is a schematic view showing an arrangement example of an imprint apparatus.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

An imprint apparatus is an apparatus that forms a pattern of a cured product of an imprint material onto which a pattern with convex and concave portions on a mold is transferred by bringing the imprint material supplied onto a substrate into contact with the mold and applying energy for curing the imprint material. For example, the imprint apparatus supplies a liquid imprint material onto a substrate, and cures the imprint material in a state in which a mold on which a pattern with convex and concave portions has been formed is in contact with the imprint material on the substrate. Then, the imprint apparatus increases the spacing between the mold and the substrate, thereby separating (mold-separating) the mold from the cured imprint material. Thus, the pattern of the mold can be transferred to the imprint material on the substrate. Such a series of processes is called an "imprint process", and is performed for each of a plurality of shot regions on the substrate.

As the imprint material, a curable composition (to be also referred to a resin in an uncured state) that is cured by receiving curing energy is used. As the curing energy, an electromagnetic wave, heat, or the like is used. The electromagnetic wave is light selected from the wavelength range of 10 nm (inclusive) to 1 mm (inclusive), for example, infrared light, a visible light beam, ultraviolet light, or the like. The curable composition is a composition cured by light irradiation or heating. A photo-curable composition cured by light contains at least a polymerizable compound and a photopolymerization initiator, and may contain a nonpolymerizable compound or a solvent as needed. The nonpolymerizable compound is at least one material selected from the group consisting of a sensitizer, a hydrogen donor, an internal mold release agent, a surfactant, an antioxidant, and a polymer component. The imprint material is applied in a film shape onto the substrate by a spin coater or a slit coater. Alternatively, the imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

First Embodiment

The first embodiment according to the present invention will be described. FIG. 1 is a schematic view showing an arrangement example of an imprint apparatus 1 according to this embodiment. The imprint apparatus 1 performs an imprint process of forming a pattern on a substrate by forming and curing an imprint material on the substrate using a mold and separating the mold from the cured imprint material. In this embodiment, a resin is used as the imprint material, and a photo-curing method of curing a resin by irradiation of ultraviolet light is employed as a resin curing method.

The imprint apparatus 1 includes a mold holder 12 that holds a mold 11, a substrate holder 14 that holds a substrate 13, a detector 15, a curing unit 25, an observation unit 23, and a controller CNT. The imprint apparatus 1 can also include a resin supplier including a dispenser configured to supply a resin onto a substrate, a shape deformation mechanism configured to deform a pattern region 11a of the mold 11 by applying a force to the side surface of the mold 11, and the like. Further, the imprint apparatus 1 can include a bridge plate configured to hold the mold holder 12, a base plate configured to hold the substrate holder 14, and the like.

The mold 11 includes the pattern region 11a (pattern surface) in which a pattern (a pattern with convex and concave portions) to be transferred to the substrate 13 (the resin thereon) has been formed. The mold 11 can be made of a material such as, for example, quartz which transmits ultraviolet light for curing the resin on the substrate. Alignment marks (mold-side marks 18) used in control of alignment between the mold 11 and the substrate 13 are formed in the pattern region 11a of the mold 11.

The mold holder 12 is a holding mechanism that holds the mold 11. The mold holder 12 includes, for example, a mold chuck that performs vacuum chuck or electrostatic chuck of the mold 11, a mold stage on which the mold chuck is placed, and a driving system that drives (moves) the mold stage. The driving system drives the mold stage (that is, the mold 11) in at least the Z-axis direction (the pressing direction of pressing the mold 11 against the resin on the substrate). The driving system may have a function of driving the mold stage not only in the Z-axis direction, but also in the X-axis direction, the Y-axis direction, and the θ direction (the rotation direction around the Z-axis).

The substrate 13 is a substrate onto which the pattern of the mold 11 is transferred (that is, a substrate on which a pattern made of the resin is formed). As the material of the substrate 13, for example, glass, ceramic, a metal, a semiconductor, a resin, or the like can be used. A member made of a material different from that of the substrate 13 may be provided on the surface of the substrate 13, as needed. The substrate 13 is, for example, a silicon wafer, a compound semiconductor wafer, silica glass, or the like. The substrate 13 may be, for example, an SOI (Silicon on Insulator) substrate or the like. A resin is supplied (applied) onto the substrate 13 from the resin supplier. Alignment marks (substrate-side marks 19) used in control of alignment between the mold 11 and the substrate 13 are formed in the substrate 13.

The substrate holder 14 is a holding mechanism that holds the substrate 13. The substrate holder 14 includes, for example, a substrate chuck that performs vacuum chuck or electrostatic chuck of the substrate 13, a substrate stage on which the substrate chuck is placed, and a driving system that drives (moves) the substrate stage. The driving system drives the substrate stage (that is, the substrate 13) in at least the X-axis direction and the Y-axis direction (directions orthogonal to the pressing direction of the mold 11). The driving system may have a function of driving the substrate stage not only in the X-axis direction and the Y-axis direction, but also in the Z-axis direction and θ direction (the rotation direction around the Z-axis).

The detector 15 can detect the positions of the alignment marks (substrate-side marks 19) provided in the substrate 13. In this embodiment, the detector 15 includes a scope that optically observes the substrate-side mark 19 via the mold 11 (mold-side mark 18), and detects the relative position between the mold-side mark 18 and the corresponding substrate-side mark 19. For example, the detector 15 can measure the relative position between the mold 11 (pattern region 11a) and the substrate (shot region) based on the relative position between the mold-side mark 18 and the corresponding substrate-side mark 19 detected by the scope. Here, the detector 15 is only required to detect the relative positional relationship between the mold-side mark 18 and the substrate-side mark 19. Therefore, the detector 15 may include a scope that includes an optical system configured to capture two marks simultaneously, or may include a scope that detects an interference signal between the two marks or a signal reflecting the relative positional relationship such as moiré. Alternatively, the detector 15 may be unable to detect the mold-side mark 18 and the substrate-side mark 19 simultaneously. For example, the detector 15 may detect the relative positional relationship between the mold-side mark 18 and the substrate-side mark 19 by obtaining the respective positions of the mold-side mark 18 and the substrate-side mark 19 with respect to a reference position arranged inside the detector 15.

The curing unit 25 irradiates the resin on the substrate with light 22 (for example, ultraviolet light) for curing the resin via the mold 11, thereby curing the resin. The curing unit 25 can include, for example, a light source that emits the light 22 for curing the resin, and an optical system configured to adjust the light 22 emitted from the light source to optimal light for the imprint process. The imprint apparatus 1 according to this embodiment can be configured such that the light 22 emitted from the curing unit 25 is reflected by a beam splitter 24 and irradiates the substrate 13 (more specifically, the resin on the substrate).

The observation unit 23 includes, for example, a camera whose field of view includes the entire pattern region 11a of the mold 11, and has a function of observing (checking) a curing state of the resin on the substrate by irradiation of ultraviolet light. The observation unit 23 can observe not only a curing state of the resin on the substrate but also a pressing state of the mold 11 against the resin on the substrate, a filling state of the pattern of the mold 11 with the resin, and a mold separating state of the mold 11 from the cured resin on the substrate. The imprint apparatus 1 according to this embodiment can be configured such that the observation unit 23 observes a curing state of the resin on the substrate via the beam splitter 24.

The controller CNT includes, for example, a CPU, a memory, and the like, and controls the imprint process and its associated process by controlling respective units of the imprint apparatus 1. For example, the controller CNT can control alignment between the mold 11 and the substrate 13 based on a detection result (that is, a detection result of the relative position between the mold-side mark 18 and the substrate-side mark 19) obtained by the detector 15. Further, the controller CNT may control a process (shape correction of the mold 11) of deforming the pattern region 11a of the mold 11 into a target shape by a shape corrector during the alignment in the imprint process.

Next, with reference to FIGS. 2A and 2B, the mold-side marks 18 and the substrate-side marks 19 serving as the alignment marks used for alignment between the mold 11 and the substrate 13 will be described. In the example shown in FIGS. 2A and 2B, six chip regions are arranged in one shot region of the substrate 13.

FIG. 2A shows an arrangement example of mold-side marks 18a to 18h provided in the pattern region 11a of the mold 11, more specifically, at the four corners of the pattern region 11a. Referring to FIG. 2A, each of the mold-side marks 18a, 18b, 18e, and 18f, whose longitudinal direction is in the horizontal direction, is the mark whose measurement direction is in the X-axis direction. Each of the mold-side marks 18c, 18d, 18g, and 18h, whose longitudinal direction is in the vertical direction, is the mark whose measurement direction is in the Y-axis direction. In FIG. 2A, a region surrounded by dotted lines represents a pattern to be transferred to each of the six chip regions on the substrate. As will be described below, in the mold 11 according to this embodiment, the pattern region 11a is formed so as to collectively form the resin on two or more transfer regions on the substrate 13 (that is, collectively form the pattern in the resin on the two or more transfer regions).

FIG. 2B shows substrate-side marks 19a to 19h provided in the periphery of one shot region 13a of the substrate 13, more specifically, at the four corners of the shot region 13a. Referring to FIG. 2B, each of the substrate-side marks 19a, 19b, 19e, and 19f, whose longitudinal direction is in the horizontal direction, is the mark whose measurement direction is in the X-axis direction. Each of the substrate-side marks 19c, 19d, 19g, and 19h, whose longitudinal direction is in the vertical direction, is the mark whose measurement direction is in the Y-axis direction. In FIG. 2B, a region surrounded by solid lines inside the shot region 13a represents a chip region 13b. Note that each chip region 13b is, for example, a region from which one semiconductor chip with an integrated circuit formed therein can be obtained.

In the imprint process, when bringing the mold 11 and the resin on the substrate into contact with each other, the respective mold-side marks 18a to 18h provided in the mold 11 and the respective substrate-side marks 19a to 19h provided in the substrate 13 come close to each other. Therefore, by the detector 15 detecting the mold-side marks 18 and the substrate-side marks 19, it is possible to compare the position and shape of the pattern region 11a of the mold 11 with the position and shape of the shot region 13a of the substrate 13. If a difference (shift) occurs between the position and shape of the pattern region 11a of the mold 11 and the position and shape of the shot region 13a on the substrate 13, overlay accuracy decreases, and this brings about a pattern transfer error (product defect).

Next, with reference to FIGS. 3A to 3C, the imprint process of transferring the pattern of the mold 11 onto the substrate 13 (more specifically, the resin on the substrate), that is, forming the resin on the substrate will be described.

Figure 3A:
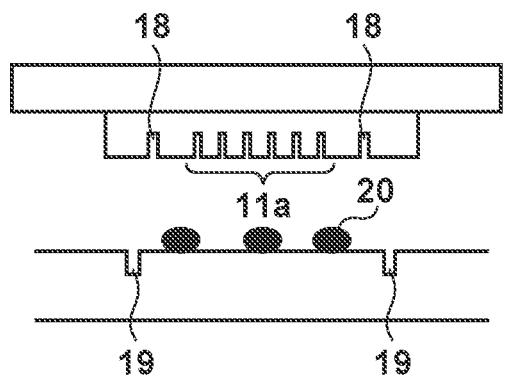
FIGS. 3A to 3C are views for explaining an imprint process.

As shown in FIG. 3A, a resin 20 is supplied to a target shot region (a shot region where the imprint process is to be performed from now on) on the substrate by the time pressing of the mold 11 is started. Because of its high volatility, the resin generally used in the imprint apparatus is preferably supplied onto the substrate immediately before performing the imprint process. However, a resin having low volatility may be supplied onto the substrate in advance by spin coating or the like. After the resin 20 is supplied onto the substrate, the substrate 13 is moved below the mold 11. Then, the detector 15 detects the relative positions between the mold-side marks 18 and the substrate-side marks 19, and based on the detection result, alignment between the mold 11 and the substrate 13 and shape correction of the mold 11 are controlled.

Figure 3B:
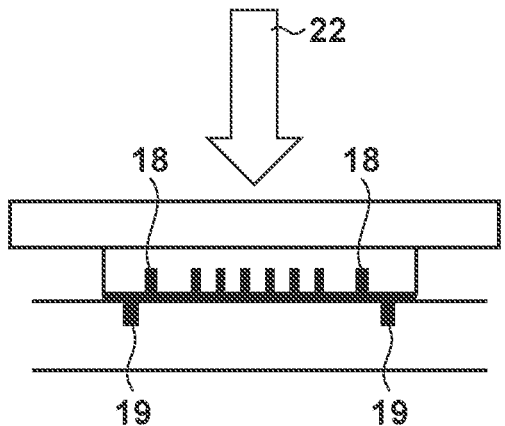
Figure 3C:
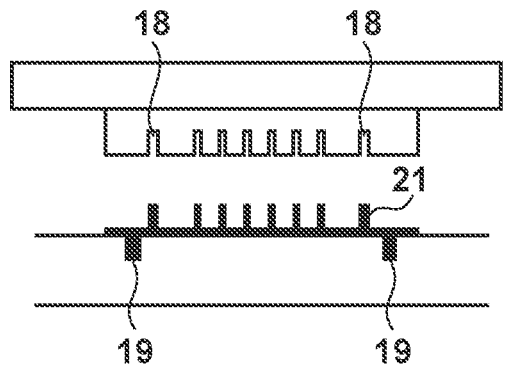

Then, as shown in FIG. 3B, the mold 11 and the resin 20 on the substrate are brought into contact with each other, and in this state, a predetermined time elapses to allow the pattern of the mold 11 to be filled with the resin 20. During this, the detector 15 may also detect the mold-side marks 18 and the substrate-side marks 19 to control alignment between the mold 11 and the substrate 13 based on the detection result. Here, if the difference in refractive index between the mold 11 and the resin 20 is small, it may be difficult for the detector 15 to detect the mold-side marks 18 when the mold-side marks 18 has only the concave-convex structure. Thus, the mold-side marks 18 may be coated with a substance having the refractive index and transmittance different from those of the mold 11, or the refractive index of each mold-side marks 18 may be changed by ion irradiation or the like. This allows the detectors 15 to detect the mold-side marks 18 even in a state in which the mold 11 and the resin 20 on the substrate are in contact with each other.

After the pattern of the mold 11 is filled with the resin 20 (for example, after the predetermined time elapses), the curing unit 25 irradiates the resin 20 on the substrate with the light 22 to cure the resin 20. Then, as shown in FIG. 3C, the mold 11 is separated from the cured resin 20 on the substrate. With this, a pattern 21 made of the resin 20 can be formed on the substrate (that is, the pattern of the mold 11 can be transferred onto the substrate).

[Multi-Area Imprinting]

In the recent years, as to the imprint apparatus 1, development of a multi-area imprint technique is in progress. The multi-area imprint technique is a technique of collectively performing imprinting on two or more transfer regions where the pattern of an original has been individually transferred in a pre-process. With this technique, the productivity (throughput) of the imprint apparatus 1 can be improved. Here, the mold 11 used in the multi-area imprint technique is formed so as to be capable of collectively forming the resin 20 on two or more transfer regions by one imprint process, the two or more transfer regions serving as one shot region (imprint region). For example, the pattern region 11a of the mold 11 has a pattern to be collectively transferred to the resin 20 on the two or more transfer regions by one imprint process. Each transfer region is a region on the substrate where the pattern formed in an original has been individually transferred, and may be called a pattern-transferred region. Each transfer region can also be called a region where the pattern of the original is transferred by one shot (for example, one transfer process) in the pre-process. For example, if an exposure apparatus is used in the pre-process, the transfer region is a region on the substrate where one pattern corresponding to the pattern of a mask serving as the original has been transferred. If an imprint apparatus is used in the pre-process, the transfer region is a region on the substrate where one pattern corresponding to the pattern of a mold serving as the original has been transferred.

Figure 4:
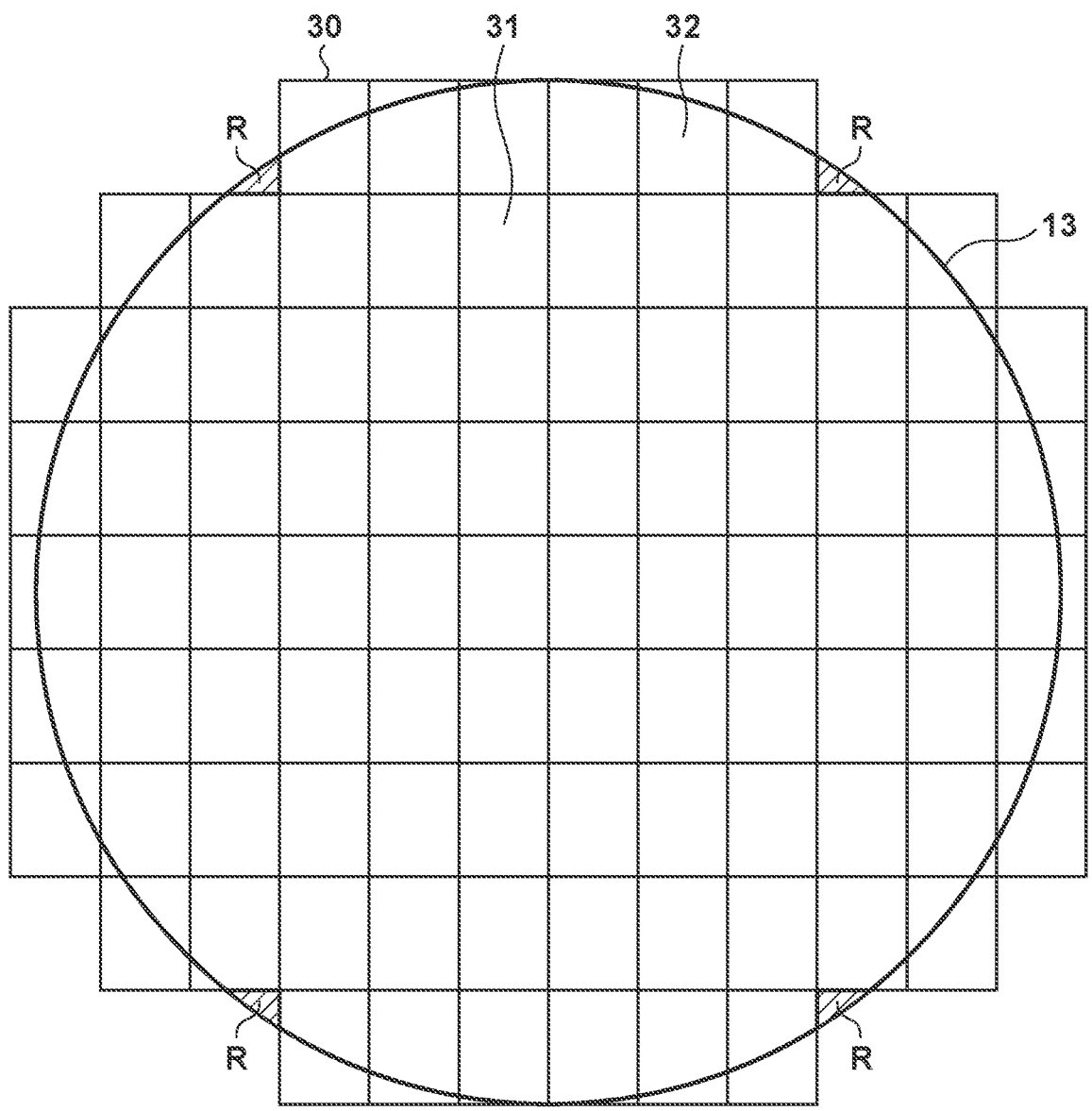
FIG. 4 is a view showing an example of the arrangement of a plurality of transfer regions on a substrate.

FIG. 4 shows an example of the layout (arrangement) of a plurality of transfer regions 30 on the substrate. The plurality of transfer regions 30 on the substrate 13 can include transfer regions 31 (full transfer regions) arranged in the central portion of the substrate 13, and transfer regions 32 (partial transfer regions), each of which is arranged in the peripheral edge portion of the substrate 13 so as to include the edge of the substrate 13 and partially lost. At least one chip region may be included in the transfer region 32 which is partially lost. Therefore, in the imprint apparatus 1, from the viewpoint of improvement in yield of semiconductor chips, it is required to accurately form the resin 20 on the substrate not only in the transfer regions 31 arranged in the central portion of the substrate 13 but also in the transfer regions 32 arranged in the peripheral edge portion of the substrate 13.

FIG. 5A shows a conventional example of the layout of a plurality of shot regions 40 (imprint regions) on the substrate. FIGS. 5B to 5D are enlarged views of representative shot regions 40 (41 to 43). The shot region 40 is a region where the pattern of the mold 11 can be transferred by one imprint process, and indicated by a black thick frame in FIG. 5A. Here, an example is shown in which the pattern region 11a of the mold 11 is formed so as to be capable of collectively transferring the pattern to the resin 20 on the two transfer regions 30. In the conventional example shown in FIG. 5A, as in the shot region 42 (FIG. 5C), there is a portion where one transfer region 32 arranged in the peripheral edge portion of the substrate 13 forms one shot region 40. In such a portion, it can be difficult to control the relative posture between the mold 11 and the substrate 13 in the contact step (step of bringing the mold 11 into contact with the resin on the substrate) in the imprint process.

For example, FIG. 6A shows an example of bringing the mold 11 (pattern region 11a) into contact with the resin 20 on the shot region 41 set in the central portion of the substrate 13. In this case, since the contact area between the pattern region 11a of the mold 11 and the resin 20 on the substrate is relatively large, it is possible to accurately control the relative posture between the mold 11 and the substrate 13 in the contact step. On the other hand, FIG. 6B shows an example of bringing the mold 11 (pattern region 11a) into contact with the resin 20 on the shot region 42 set in the peripheral edge portion of the substrate 13. In this case, in the edge portion of the pattern region 11a of the mold 11, the mold 11 can contact the resin 20 on the shot region 42 with a relatively small area. Therefore, a moment to rotate the mold 11 is generated as indicated by an arrow A in FIG. 6B, and it can be difficult to accurately control the relative posture between the mold 11 and the substrate 13 in the contact step. That is, it can be difficult to accurately control the film thickness (for example, RLT (Residual Layer Thickness)) of the resin 20 on the substrate. In this case, newly adding a mechanism for accurately controlling the relative posture between the mold 11 and the substrate 13 can be disadvantageous in terms of the complicated apparatus arrangement and the apparatus cost.

Therefore, in this embodiment, as shown in FIG. 7A, the layout of the plurality of shot regions 40 on the substrate 13 can be set such that each shot region 40 includes two or more transfer regions 30. That is, the imprint apparatus 1 according to this embodiment collectively performs the imprint process on two or more transfer regions 30 serving as one shot region 40. As compared to the conventional example shown in FIG. 5A, this can facilitate control of the relative posture between the mold 11 and the substrate 13 in the contact step even when the imprint process is performed on the transfer region 32 arranged in the peripheral edge portion of the substrate 13. Thus, it is possible to accurately form the resin 20 on the transfer region 32. Note that FIG. 7A shows an example of the layout of the plurality of shot regions 40 (imprint regions) in this embodiment, and FIGS. 7B to 7D are enlarged views of representative shot regions 40 (44 to 46).

The controller CNT of the imprint apparatus 1 can set (determine) the layout of the plurality of shot regions 40 on the substrate 13. In this case, the controller CNT can obtain information indicating the arrangement of the plurality of transfer regions 30 on the substrate 13 from the apparatus (exposure apparatus or the like) used in the pre-process, and set the layout such that each shot region 40 includes two or more transfer regions 30 based on the information. At this time, the controller CNT preferably sets the layout such that the same number of transfer regions 30 are included in each shot region 40 of the plurality of shot regions 40. Note that setting of the layout may be performed by an external computer of the imprint apparatus 1.

Here, as shown in FIG. 4, in addition to the plurality of transfer regions 30 where the pattern of the original has been individually transferred in the pre-process, the substrate 13 may include non-transfer regions R where the pattern of the original has not been transferred in the pre-process. The non-transfer region R is, for example, a region whose size does not include even one chip region, that is, a region having an area smaller than one chip region, and may be called non-pattern-transferred region. Thus, transfer of the pattern of the mold 11 onto the non-transfer region R in the imprint process is unnecessary. However, if the resin 20 on the non-transfer region R is not formed, the substrate 13 in the non-transfer region R is etched during the etching process or the like in a post-process. Therefore, from the viewpoint of protection of the substrate 13 in the etching process or the like, it is preferable to form the resin 20 using the mold 11 also in the non-transfer region R.

However, if a single non-transfer region R is set as one shot region 40 like the shot region 43 of the conventional example shown in FIG. 5D, it can be difficult to accurately control the relative posture between the mold 11 and the substrate 13 in the contact step. That is, it can be difficult to accurately control the film thickness (for example, RLT (Residual Layer Thickness)) of the resin 20 on the substrate. Therefore, in this embodiment, like the shot region 46 shown in FIG. 7D, the layout of the plurality of shot regions 40 is set such that the non-transfer region R forms one shot region 40 together with at least one transfer region 30. That is, the imprint apparatus 1 according to this embodiment collectively performs the imprint process on the non-transfer region R and at least one transfer region 30 as one shot region 40. With this, it is possible to accurately form the resin 20 on the non-transfer region R such that the film thickness (for example, RLT) of the resin 20 on the non-transfer region R falls within a target range.

[Alignment of Shot Region]

Since the continuity of the substrate 13 is interrupted in the peripheral edge portion of the substrate 13, a peculiar behavior may be exhibited therein due to processing of the substrate 13 in the pre-process. For example, in the peripheral edge portion of the substrate 13, the etching rate, the deposition rate, or the like may be different from that in the central portion of the substrate 13, and nonuniformity or uneven processing amount may occur in the etching or deposition. That is, at the substrate-side mark 19 provided in the transfer region 32 in the peripheral edge portion of the substrate 13, the reliability is low since a detection error may occur due to a deformation, uneven film thickness, or the like. If alignment between the mold 11 and the substrate 13 is performed using such the substrate-side mark 19, it can be difficult to accurately form the resin 20 on the substrate (that is, accurately transfer the pattern of the mold 11 to the resin 20 on the substrate).

Therefore, the imprint apparatus 1 according to this embodiment controls alignment of a specific shot region using a detection result of the substrate-side mark 19 provided in the transfer region other than the smallest transfer region among the two or more transfer regions 30 included in the specific shot region. The specific shot region is, among the plurality of shot regions 40 on the substrate 13, a shot region including two or more transfer regions 30 having different sizes. More specifically, the specific shot region can be a shot region including the transfer region 32 arranged in the peripheral edge portion of the substrate 13. The specific shot region can also be called a shot region which is arranged in the peripheral edge portion of the substrate 13 and to which only a part of the pattern of the mold 11 is transferred. In the example shown in FIG. 7C, the shot region 45 is exemplified as the specific shot region.

For example, the controller CNT determines, based on the information indicating the arrangement of the plurality of transfer regions 30 on the substrate 13, whether the area of the smallest transfer region 30 included in each shot region 40 is smaller than a predetermined ratio to the maximum area where the pattern of the original is transferred in the pre-process. With this, the controller CNT can determine (decide), as the specific shot region, the shot region 40 including the transfer region 30 whose area is smaller than the predetermine ratio to the maximum area. Although the predetermined ratio can be arbitrarily set, it can be set to, for example, half (½), ⅓, ¼, ⅕ or the like of the maximum area. The maximum area is, for example, the area of the transfer region 31 arranged in the central portion of the substrate, and may be referred to as a maximum transferred area hereinafter.

Next, a method of selecting a predetermined number of substrate-side marks 19 used for the alignment from the plurality of substrate-side marks 19 provided in each shot region 40 will be described with reference to FIGS. 7B to 7D. In this description, an example will be described in which four substrate-side marks 19 are selected as the predetermined number of substrate-side marks 19 from the plurality of substrate-side marks 19 provided in each region 40. However, the number of substrate-side marks 19 to be selected is not limited to four, and can be arbitrarily set. For example, if a plurality of scopes each configured to detect one substrate-side mark 19 are provided in the detector 15, the substrate-side marks 19 corresponding to the number of scopes can be selected. Further, in this description, it is assumed that 3×4=12 substrate-side marks 19 are formed in the transfer region 30 (that is, transfer region 31) where the entire pattern of the original has been transferred in the pre-process. In the examples shown in FIGS. 7B to 7D, each substrate-side mark 19 is indicated by a circle mark. The selected substrate-side mark 19 is indicated by a black circle mark, and the non-selected substate-side mark 19 is indicated by a white circle mark.

The controller CNT selects, from the plurality of substrate-side marks 19 provided in the shot region 40, the predetermined number (for example, four) of substrate-side marks 19 to be detected by the detector 15 in alignment between the mold 11 and the substrate 13. At this time, the controller CNT preferably selects, from the plurality of substrate-side marks 19 provided in the shot region 40, the predetermined number of substrate-side marks 19 possibly spaced apart from each other. By selecting the predetermined number of substrate-side marks 19 as described above, it is possible to accurately obtain the rotation component, magnification component, and the like of the shot region 42 based on a detection result obtained by the detector 15. As for the shot region 44 shown in FIG. 7B, based on the principle described above, the controller CNT can select, as the substrate-side marks 19 used for alignment, the four substrate-side marks 19 formed at four corners of the shot region 44. Note that the shot region 44 is a shot region arranged in the central portion of the substrate 13, and the two or more transfer regions 30 included therein have the same size. That is, the shot region 44 is a shot region which is not determined (decided) as the specific shot region.

On the other hand, the shot region 45 shown in FIG. 7C is a shot region determined as the specific shot region. As for the shot region 45, the controller CNT selects the predetermined number of substrate-side marks 19 used for alignment from the substrate-side marks 19 provided in the transfer region other than the smallest transfer region among the two or more transfer regions 30 included in the shot region 45. For example, as shown in FIG. 7C, a first transfer region 30a and a second transfer region 30b smaller than the first transfer region 30a are included in the shot region 45. In this case, the second transfer region 30b is the smallest transfer region 30, so that the controller CNT selects the predetermined number of substrate-side marks 19 used for alignment not from the second transfer region 30b but from the first transfer region 30a. That is, the controller CNT controls alignment of the shot region 45 as the specific shot region based on the detection result of the substrate-side mark 19 provided in the first transfer region 30a without using the detection result of the substrate-side mark 19 provided in the second transfer region 30b. In this case, the controller CNT may cause the detector 15 not to detect the position of the substrate-side mark 19 provided in the second transfer region 30b. Thus, it can be avoided to use the substrate-side mark 19 that is likely to cause a detection error in alignment, and the resin 20 on the substrate can be accurately formed. That is, it is also possible to accurately form the resin in the transfer region 32 arranged in the peripheral edge portion of the substrate 13, so that the pattern can be accurately formed in the chip region of the transfer region 32 and the yield of semiconductor chips or the like can be improved.

There may be a case in which no substrate-side mark 19 is formed in the non-transfer region R. Therefore, as for the shot region 46 including the non-transfer region R as shown in FIG. 7D, the controller CNT can select the predetermined number of substrate-side marks 19 used for alignment from a transfer region 30c included in the shot region 46. Then, based on the detection result of the selected substrate-side mark 19, the controller CNT can control alignment of the shot region 46. If two or more transfer regions 30 are included in the shot region 46 including the non-transfer region R, the alignment may be controlled as described above based on the detection result of the substrate-side mark 19 provided in the transfer region other than the smallest transfer region among the two or more transfer regions 30.

Here, in alignment between the mold 11 and the substrate 13 in the imprint process according to this embodiment, an overlay error may occur in the transfer region 30 where no substrate-side mark 19 is selected or in the non-transfer region R. For example, as for the transfer region 30 where the substrate-side marks 19 have been selected, it is possible to accurately obtain the shift component, the rotation component, the magnification component, the difference in shot shape, and the like. On the other hand, in the transfer region 30 where no substrate-side mark 19 has been selected, it can be difficult to accurately obtain the above-described components, so that an overlay error may occur between the pattern region 11a of the mold 11 and this transfer region 30. It is conceivable that this overlay error is reproduced in the subsequent imprint process. Therefore, it is preferable to calculate the overlay error from the result of the preceding imprint process and obtain an offset value (correction value) used to correct the overlay error. More specifically, the shift amount and the shape difference are measured between the underlying pattern of the substrate 13 and the pattern formed in the resin 20 by the imprint process (or the pattern obtained after etching the substrate 13 using, as a mask, the resin 20 formed with the pattern). With this, an offset value used to correct the shift amount and the shape difference can be obtained based on the measurement result. Such an offset value is preferably obtained for each shot region 40 (for example, specific shot region). Further, the offset value may be updated every time the imprint process is performed.

If there is a difference (error) in parameter such as the substrate thickness between substrates or lots, the parameter may be measured before the imprint process, and an offset value (correction value) used to correct the difference in parameter may be stored in the imprint apparatus 1 (controller CNT). The controller CNT can reduce (improve) the difference in parameter by controlling the imprint process (for example, alignment between the mold 11 and the substrate 13) based on the offset value. Such measurement of the parameter may be performed by an external apparatus of the imprint apparatus 1, or may be performed using a measurement unit arranged inside the imprint apparatus 1. A difference in parameter may be calculated (predicted) from the detection result of the position of the substrate-side mark 19 selected in each shot region 40. Further, for example, since a change in parameter on the substrate often changes concentrically in general due to the influence of chemical mechanical polishing (CMP) or spin coating in the pre-process, the change in parameter can be predicted based on the tendency thereof and the historical information so far.

When setting the layout of the plurality of shot regions 40 such that each shot region 40 includes two or more transfer regions 30, the number of the transfer regions 30 included in each shot region 40 (that is, the size of the pattern region 11a of the mold 11) may be adjusted. For example, the layout setting described above can be implemented by adjusting the size of one shot region 40 on the substrate 13 or adjusting the layout of the plurality of shot regions 40. In each of the second and third embodiments to be described below, an example will be described in which the number of transfer regions in one shot region is adjusted.

Further, it is desirable that in each of the plurality of shot regions 40 on the substrate 13, transfer of the pattern of the original in the pre-process is performed on the same conditions. For example, when a scanning exposure apparatus (scanner) is used to transfer the pattern of the original in the pre-process, up scanning (scanning exposure in a first scanning direction) and down scanning (scanning exposure in a second scanning direction opposite to the first scanning direction) can be repeated for each transfer region. Therefore, in order to reduce errors among the plurality of shot regions on the substrate 13, it is desired that the scanning direction during scanning exposure is the same among the plurality of shot regions 40. As an example, when each shot region 40 includes two or more transfer regions 30, scanning exposure is preferably controlled such that the scanning direction is the same among the transfer regions 30 whose positions in the respective shot regions 40 correspond to each other (identical). When each shot region 40 includes two transfer regions 30 as shown in FIG. 7A, in the transfer region 31 on the left side in the drawing surface of the two transfer regions 30, scanning exposure in the first scanning direction (for example, +Y direction) is performed. On the other hand, in the transfer region 31 on the right side in the drawing surface, scanning exposure in the second scanning direction (for example, −Y direction) is performed. With this, errors among the plurality of shot regions on the substrate 13 can be reduced, and the same offset value can be applied to the transfer regions 30 where the scanning direction is the same.

As has been described above, in this embodiment, the layout of the plurality of shot regions 40 on the substrate 13 is set such that each shot region 40 includes two or more transfer regions 30. The imprint apparatus 1 controls the imprint process of each shot region 40 in accordance with the layout. Further, the imprint apparatus 1 controls alignment of a specific shot region using the detection result of the substrate-side mark 19 provided in the transfer region other than the smallest transfer region among the two or more transfer regions 30 included in the specific shot region. With this, it can be avoided to use the substrate-side mark 19 that is likely to cause a detection error in alignment, and the resin 20 on the substrate can be accurately formed.

Second Embodiment

The second embodiment according to the present invention will be described. In this embodiment, an example will be described in which a pattern region 11a of a mold 11 is formed so as to be capable of collectively forming a resin 20 (for example, collectively transferring a pattern) on three transfer regions 30. Note that this embodiment basically takes over the first embodiment, and the arrangement and process of an imprint apparatus 1 are similar to those in the first embodiment unless otherwise specified below.

FIG. 8A is a view showing an example of the layout of a plurality of shot regions 50 in this embodiment. FIGS. 8B and 8C are enlarged views of representative shot regions 50 (51 and 52). In the example shown in FIG. 8A, the shot region 51 including three transfer regions 30 and the shot region 52 including two transfer regions 30 can be set. For example, in the shot region 51 including three transfer regions, substrate-side marks 19 used for alignment can be selected from, among three transfer regions 30d to 30f, the transfer regions 30d and 30e other than the smallest transfer region 30f. Since the transfer region 30e includes more substrate-side marks 19 than the transfer region 30f, it is possible to increase options for the substrate-side marks 19. For example, even if there are problems with some substrate-side marks 19 among the substrate-side marks 19 provided in the transfer region 30e, the other substrate-side marks 19 can be selected. Note that in FIGS. 8B and 8C, as in FIGS. 7B to 7D, the selected substrate-side mark 19 is indicated by a black circle mark, and the non-selected substrate-side mark 19 is indicated by a white circle mark. On the other hand, in the shot region 52 including two transfer regions 31g and 31h, the substrate-side marks 19 used for alignment can be selected from the transfer region 31g other than the smallest transfer region 31h among the two transfer regions 31g and 31h.

Third Embodiment

The third embodiment according to the present invention will be described. In this embodiment, an example will be described in which a pattern region 11a of a mold 11 is formed so as to be capable of collectively forming a resin 20 (for example, collectively transferring a pattern) on four transfer regions 30. Note that this embodiment basically takes over the first and second embodiments, and the arrangement and process of an imprint apparatus 1 are similar to those in the first embodiment unless otherwise specified below.

FIG. 9A is a view showing an example of the layout of a plurality of shot regions 60 in this embodiment. FIGS. 9B and 9C are enlarged views of representative shot regions 60 (61 and 62). For example, in the shot region 61, substrate-side marks 19 used for alignment can be selected from, among transfer regions 30i to 30k included in the shot region 61, the transfer regions 30j and 30k other than the smallest transfer region 30i. At this time, the substrate-side mark 19 closest to the edge of the substrate 13 (for example, the substrate-side mark 19 existing within a predetermined range from the edge of the substate 13) may be intentionally excluded from options. The substrate-side marks 19 may not be selected from all the transfer regions 30j and 30k other than the smallest transfer region 30i and, for example, the substrate-side marks 19 may be selected only from the largest transfer region 30j. As another example, in the shot region 62, the substrate-side marks 19 used for alignment can be selected from, among three transfer regions 30l to 30n included in the shot region 62, the transfer regions 30l and 30m other than the smallest transfer region 30n.

<Embodiment of Method of Manufacturing Article>

A method of manufacturing an article according to the embodiment of the present invention is suitable for manufacturing an article, for example, a microdevice such as a semiconductor device or an element having a microstructure. The method of manufacturing an article according to the embodiment includes a step of forming a pattern to an imprint material supplied (applied) onto a substrate by using the above-described imprint apparatus and a step of processing the substrate on which the pattern has been formed in the preceding step. Furthermore, this manufacturing method includes other well-known steps (for example, oxidization, deposition, vapor deposition, doping, planarization, etching, resist removal, dicing, bonding, and packaging, and the like). The method of manufacturing an article according to the embodiment is superior to a conventional method in at least one of the performance, quality, productivity, and production cost of the article.

The pattern of a cured material formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile or nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured material is directly used as the constituent member of at least some of the above-described articles or used temporarily as a resist mask. After etching or ion implantation is performed in the substrate processing step, the resist mask is removed.

Figure 10A:
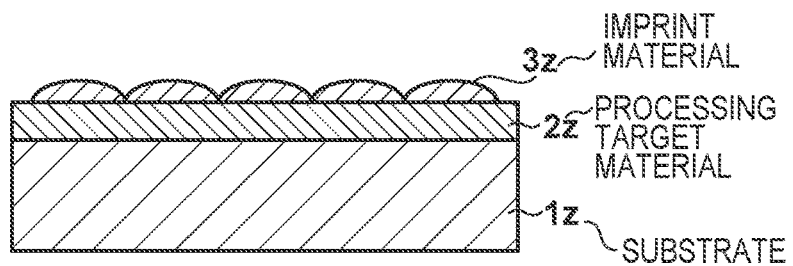
FIGS. 10A to 10F are views for explaining a method of manufacturing an article.

A detailed method of manufacturing an article will be described next. As shown in FIG. 10A, a substrate 1z such as a silicon wafer with a target material 2z to be processed such as an insulator formed on the surface is prepared. Next, an imprint material 3z is applied to the surface of the target material 2z by an inkjet method or the like. A state in which the imprint material 3z is applied as a plurality of droplets onto the substrate is shown here.

Figure 10B:
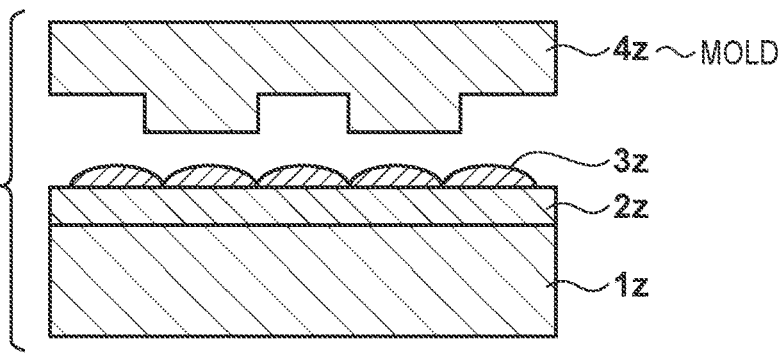
Figure 10C:
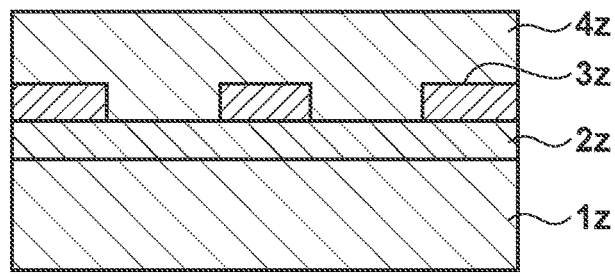

As shown in FIG. 10B, a mold 4z for imprint is caused to face to the substrate 1z such that a pattern with convex and concave portions formed in the mold 4z is directed to the imprint material 3z on the substrate 1z. As shown in FIG. 10C, the mold 4z and the imprint material 3z applied on the substrate 1z are brought into contact with each other, and subjected to a pressure. The gap between the mold 4z and the target material 2z is filled with the imprint material 3z. In this state, by irradiating the imprint material 3z with energy for curing through the mold 4z, the imprint material 3z is cured.

Figure 10D:
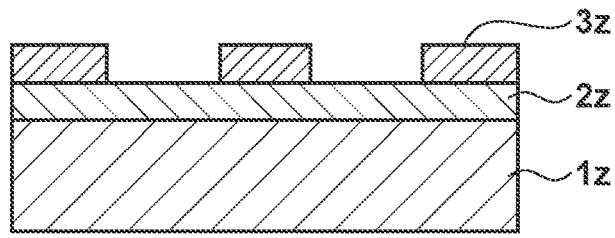

As shown in FIG. 10D, after the imprint material 3z is cured, the mold 4z is separated from the substrate 1z. Then, the pattern of the cured material of the imprint material 3z is formed on the substrate 1z. In the pattern of the cured material, the concave portion of the mold corresponds to the convex portion of the cured material, and the convex portion of the mold corresponds to the concave portion of the cured material. That is, the pattern with convex and concave portions in the mold 4z is transferred to the imprint material 3z.

Figure 10E:
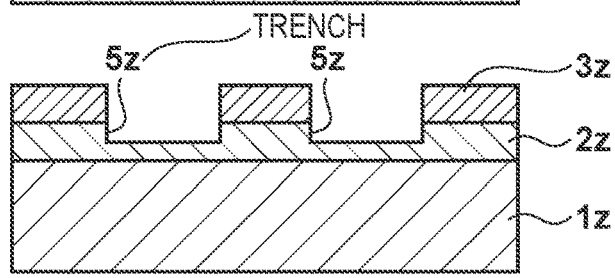
Figure 10F:
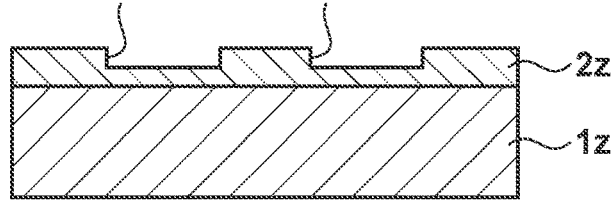

As shown in FIG. 10E, by performing etching process using the pattern of the cured material as an etching resistant mask, a portion of the surface of the target material 2z where the cured material does not exist or remains thin is removed to form a groove 5z. As shown in FIG. 10F, by removing the pattern of the cured material, an article with the grooves 5z formed in the surface of the target material 2z can be obtained. Here, the pattern of the cured material is removed. However, instead of processing or removing the pattern of the cured material, it may be used as, for example, an interlayer dielectric film included in a semiconductor element or the like, that is, a constituent member of an article.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as anon-transitory computer-readable storage medium) to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-142790 filed on Aug. 26, 2020, which is hereby incorporated by reference herein in its entirety.

What is claimed is:

1. An imprint apparatus that performs an imprint process of forming an imprint material on a substrate using a mold, for each of a plurality of shot regions on the substrate, the apparatus comprising:
   a mold holder configured to hold the mold;
   a substrate holder configured to hold the substrate;
   a driving system configured to relatively drive the mold holder and the substrate holder;
   a curing unit configured to cure the imprint material;
   a detector configured to detect positions of marks provided in the substrate; and
   a controller configured to control the imprint process which includes alignment between the substrate and the mold based on a detection result by the detector,
   wherein the substrate includes a plurality of transferred regions each of which has an underlying pattern formed thereon before the imprint process and a non-transferred region which does not have the underlying pattern,
   wherein the mold is configured to be capable of collectively forming the imprint material on at least two transferred regions among the plurality of transferred regions, by serving the at least two transferred regions as one shot region,
   wherein the controller determines a layout of the plurality of shot regions on the substrate so as to satisfy either of a first condition in which one shot region includes two or more transferred regions or a second condition in which one shot region includes the non-transferred region and one or more transferred regions, and controls the imprint process for each shot region in accordance with the determined layout, and
   wherein, in the imprint process for a specific shot region including two or more transferred regions which have different sizes from each other, the controller controls the alignment based on a detection result by the detector for marks provided in at least one transferred region other than a smallest transferred region among the two or more transferred regions included in the specific shot region.

2. The apparatus according to claim 1, wherein
   in the imprint process for the specific shot region, the controller controls the alignment without using a detection result by the detector for marks provided in the smallest transferred region.

3. The apparatus according to claim 1, wherein
   in the imprint process for the specific shot region, the controller causes the detector not to detect positions of marks provided in the smallest transferred region.

4. The apparatus according to claim 1, wherein an area of the smallest transferred region among the two or more transferred regions included in the specific shot region is smaller than half of a maximum area of each of the plurality of transferred regions.

5. The apparatus according to claim 1, wherein
   the specific shot region is a shot region which is arranged in a peripheral edge portion of the substrate and to which only a part of a pattern of the mold is transferred.

6. The apparatus according to claim 1, wherein
   the controller determines the layout based on information indicating an arrangement of the plurality of the transferred regions on the substrate.

7. The apparatus according to claim 1, wherein
   each of the two or more transferred regions includes at least one chip region.

8. The apparatus according to claim 1, wherein
   each of the two or more transferred regions included in the specific shot region does not have a mark which is commonly used among the two or more transferred regions.

9. The apparatus according to claim 1, wherein the controller determines the layout such that the number of transferred regions is the same among shot regions which satisfy the second condition.

10. The apparatus according to claim 1, wherein
    the controller controls the alignment in the imprint process for the specific shot region, by using the smaller number of marks than the number of marks used in the alignment of a shot region including two or more transferred regions which have the same sizes with each other.

11. The apparatus according to claim 1, wherein
    the detector is configured to a relative position between marks provided in the mold and marks provided in the substrate.

12. A method of manufacturing an article, the method comprising:
    forming a pattern on a substrate by using an imprint apparatus according to claim 1; and
    processing the substrate, on which the pattern has been formed, to manufacture the article.

* * * * *